(12) United States Patent
Zhang et al.

(10) Patent No.: US 9,875,996 B2
(45) Date of Patent: Jan. 23, 2018

(54) COMPOSITE SUBSTRATE FOR LIGHT EMITTING DEVICE AND LED MODULE WITH THE SAME

(71) Applicant: KAISTAR Lighting (Xiamen) Co., Ltd., Xiamen (CN)

(72) Inventors: Jing-qiong Zhang, Xiamen (CN); Tzu-chi Cheng, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 211 days.

(21) Appl. No.: 14/881,126

(22) Filed: Oct. 12, 2015

(65) Prior Publication Data

US 2017/0018681 A1   Jan. 19, 2017

(30) Foreign Application Priority Data

Jul. 17, 2015  (CN) .......................... 2015 1 0423059

(51) Int. Cl.
*H01L 33/20*     (2010.01)
*H01L 25/075*    (2006.01)
(Continued)

(52) U.S. Cl.
CPC .......... *H01L 25/0753* (2013.01); *H01L 33/20* (2013.01); *H01L 33/36* (2013.01); *H01L 33/385* (2013.01); *H01L 33/62* (2013.01); *H01L 33/64* (2013.01); *H05K 1/021* (2013.01); *H05K 1/184* (2013.01); *H05K 2201/10106* (2013.01)

(58) Field of Classification Search
CPC ....... H01L 33/20; H01L 33/36; H01L 33/385; H01L 33/64
See application file for complete search history.

(56) References Cited

U.S. PATENT DOCUMENTS

| 2010/0123147 A1* | 5/2010 | Jeong | H01L 33/20 257/94 |
| 2012/0119228 A1* | 5/2012 | Hsia | H01L 33/641 257/88 |

(Continued)

FOREIGN PATENT DOCUMENTS

| CN | 102044622 A | 5/2011 |
| CN | 102330900 A | 1/2012 |

(Continued)

*Primary Examiner* — Phat X Cao
(74) *Attorney, Agent, or Firm* — Hemisphere Law, PLLC (57) ABSTRACT

The invention relates to a composite substrate for light emitting device and a LED module equipped with the composite substrate for light emitting device. The composite substrate for light emitting device includes a metal substrate, an insulating carrier and an electrode, the metal substrate and the insulating carrier respectively have a front side and a back side that are opposite, the insulating carrier is disposed on the periphery of the metal substrate and connected to the metal substrate, the electrode is disposed on the insulating carrier, the electrode penetrates the insulating carrier, the electrode has a front side and a back side that are opposite, the heights of the back sides of the insulating carrier and the electrode are less than that of the back side of the metal substrate. The present invention also provides a LED module. The composite substrate for light emitting device can reduce costs.

20 Claims, 5 Drawing Sheets

(51) Int. Cl.
H01L 33/38 (2010.01)
H01L 33/36 (2010.01)
H01L 33/62 (2010.01)
H01L 33/64 (2010.01)
H05K 1/02 (2006.01)
H05K 1/18 (2006.01)

(56) References Cited

U.S. PATENT DOCUMENTS

| | | | | |
|---|---|---|---|---|
| 2014/0036461 | A1* | 2/2014 | Palaniswamy | H01L 33/486 |
| | | | | 361/762 |
| 2014/0306230 | A1* | 10/2014 | Chen | H01L 33/20 |
| | | | | 257/76 |

FOREIGN PATENT DOCUMENTS

| | | |
|---|---|---|
| CN | 202585530 U | 12/2012 |
| CN | 204809260 U | 11/2015 |
| TW | 200628057 A | 8/2006 |
| TW | M489377 | 7/2014 |
| TW | 201515279 A | 4/2015 |

* cited by examiner

COMPOSITE SUBSTRATE FOR LIGHT EMITTING DEVICE AND LED MODULE WITH THE SAME

BACKGROUND

1. Technical Field

The present invention relates to the field of LED light technology, particularly to a composite substrate for light emitting device and a LED module equipped with the composite substrate for light emitting device.

2. Description of the Related Art

A light emitting diode (LED) is a solid semiconductor device that can convert electricity into visible light. Due to the advantages such as low energy consumption, extended lifetime and environmental safety, LED is the optimum substitute for the conventional light, which can spread widely.

A LED module can include a LED chip, a chip on board (COB) substrate, a printed circuit board and a heat sink. The LED chip is disposed on the substrate and connected to the printed circuit board electrically by an electrode on the COB substrate. The heat sink is disposed below the COB substrate, which is used for dissipating thermal that generates from the light emitting of the LED chip.

An electrode of a conventional COB substrate can merely be disposed on the front side of the COB substrate, in order to reduce abnormality while welding. The COB substrate can work with a connector. However, the connector is expensive, which can raise the cost of the LED module.

SUMMARY

Therefore, the present invention provides a composite substrate for light emitting device and a LED module equipped with the composite substrate for light emitting device to overcome the shortcoming of the prior art.

Specifically, a composite substrate for light emitting device according to the exemplary embodiment in the present invention includes a metal substrate, an insulating carrier and an electrode, the metal substrate and the insulating carrier respectively have a front side and a back side that are opposite, the insulating carrier is disposed on the periphery of the metal substrate and connected to the metal substrate, the electrode is disposed on the insulating carrier, the electrode penetrates the insulating carrier, the electrode has a front side and a back side that are opposite, the heights of the back side of the insulating carrier and the back side of the electrode are less than that of the back side of the metal substrate.

In an exemplary embodiment of the present invention, the difference in height of the back side of the electrode and the back side of the metal substrate is more than 0.2 mm, preferably 0.25 mm.

In an exemplary embodiment of the present invention, the metal substrate is preferably made of copper.

In an exemplary embodiment of the present invention, a plurality of holes are defined on the metal substrate, the holes are filled with insulation materials, the insulating carrier has a plurality of convex structures that are prolonged towards the metal substrate, the convex structures are connected to the insulation materials in the holes.

In an exemplary embodiment of the present invention, the insulating carrier forms a waterproof structure close to the bottom of the metal substrate, the waterproof structure is a waterproof groove.

In an exemplary embodiment of the present invention, the waterproof structure has an inner side, an upper side, an outer side and a bottom that are connected to each other in order, the inner side is close to the metal substrate and forms a reflecting surface, the outer side and the inner side are opposite, the outer side the inner side are connected by the upper side and formed a groove face, the bottom is opposite to the upper side, roughening structures are formed on the upper side and the bottom respectively.

In an exemplary embodiment of the present invention, a roughening structure is formed on the connection surface of the insulating carrier and the metal substrate.

In an exemplary embodiment of the present invention, a roughening structure is formed on the connection surface of the insulating carrier and the electrode.

In an exemplary embodiment of the present invention, the insulating carrier is an integrated structure.

In an exemplary embodiment of the present invention, the electrode includes a cathode and an anode.

In an exemplary embodiment of the present invention, the electrode forms a welding region close to the metal substrate.

The present invention also provides a LED module, including a printed circuit board, a composite substrate for light emitting device, a LED chip and a heat sink, the composite substrate for light emitting device includes a metal substrate, an insulating carrier and an electrode, the metal substrate and the insulating carrier respectively have a front side and a back side that are opposite, the insulating carrier is disposed on the periphery of the metal substrate and connected to the metal substrate, the electrode is disposed on the insulating carrier, the LED chip is disposed on the front side of the metal substrate and connected to the electrode electrically, the electrode penetrates the insulating carrier, the electrode has a front side and a back side that are opposite, the heights of the back side of the insulating carrier and the back side of the electrode are less than that of the back side of the metal substrate, the printed circuit board is connected to the back side of the insulating carrier and the back side of the electrode, the printed circuit board is connected to the electrode electrically, the heat sink is connected to the back side of the metal substrate thermally.

In an exemplary embodiment of the present invention, the difference in height of the back side of the electrode and the back side of the metal substrate is more than 0.2 mm, preferably 0.25 mm.

In an exemplary embodiment of the present invention, the thickness of the printed circuit board is less than or equal to the difference in height of the back side of the electrode and the back side of the metal substrate.

In an exemplary embodiment of the present invention, the metal substrate is made of copper.

In an exemplary embodiment of the present invention, a plurality of holes are defined on the metal substrate, the holes are filled with insulation material, the insulating carrier has a plurality of convex structures that are prolonged towards the metal substrate, the convex structures are connected to the insulation material in the holes.

In an exemplary embodiment of the present invention, the insulating carrier forms a waterproof structure close to the bottom of the metal substrate, the waterproof structure is a waterproof groove.

In an exemplary embodiment of the present invention, the waterproof structure has an inner side, an upper side, an outer side and a bottom that are connected to each other in order, the inner side is close to the metal substrate and forms a reflecting surface, the outer side and the inner side are opposite, the outer side and the inner side are connected by the upper side and formed a groove face, the bottom is opposite to the upper side, roughening structures are formed on the upper side and the bottom respectively.

In an exemplary embodiment of the present invention, a roughening structure is formed on a connection surface of the insulating carrier and the metal substrate, a roughening structure is formed on a connection surface of the insulating carrier and the electrode, the insulating carrier is an integrated structure.

In an exemplary embodiment of the present invention, the electrode comprises a cathode and an anode, the electrode forms a welding region where close to the metal substrate.

According to the LED module and the composite substrate for light emitting device in the exemplary embodiments of the present invention, as the electrode of the composite substrate for light emitting device penetrates the insulating carrier, the back side of the electrode can be connected to the printed circuit board electrically, which can make the connector skipped and reduce costs correspondingly.

These and other features and advantages of the various embodiments disclosed herein will be better understood with respect to the following description and drawings. As such, the figures are used for purposes of illustration rather than limits, and the drawings are only schematic and the sizes of components merely aim at clarifying the described structure and the process.

BRIEF DESCRIPTION OF THE DRAWINGS

In the following detailed description of the preferred embodiments, reference is made to the accompanying drawings which form a part hereof, and in which is shown by way of illustration specific embodiments in which the invention may be practiced.

DETAILED DESCRIPTION OF THE INVENTION

The above embodiments will become more readily apparent to those ordinarily skilled in the art after reviewing the following detailed description and accompanying drawings.

First Exemplary Embodiment

Figure 1:
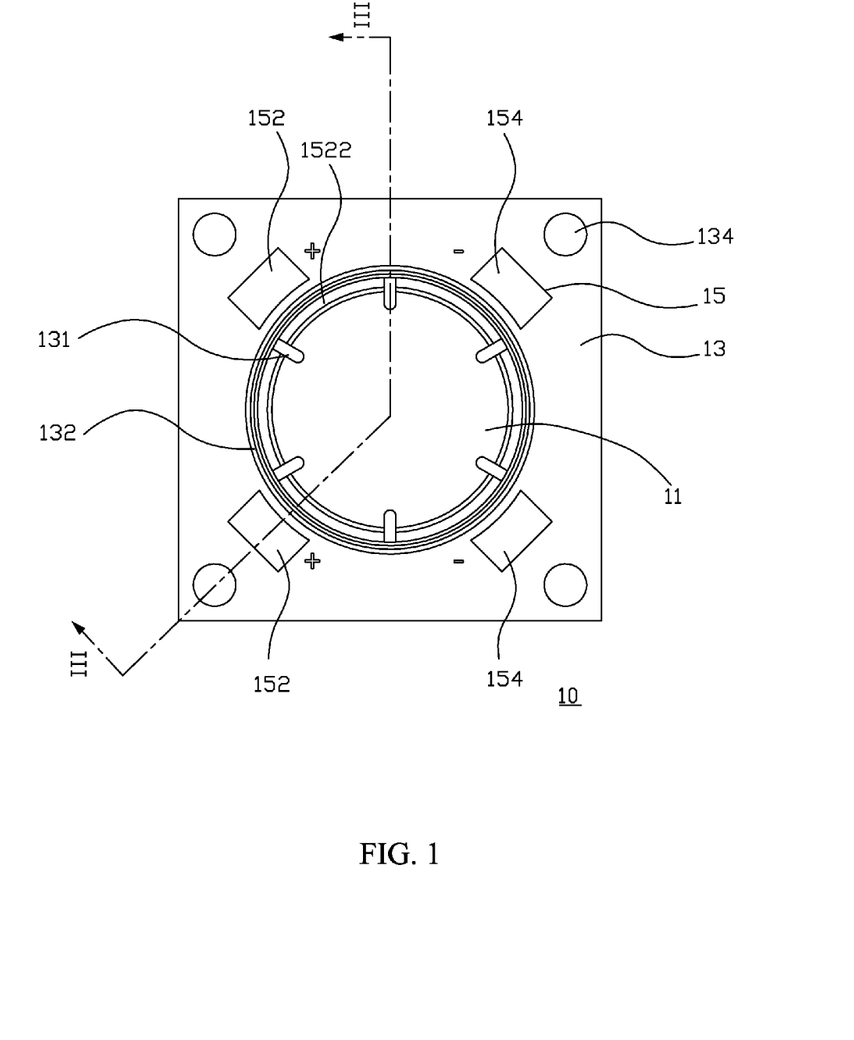
FIG. 1 is a top perspective view of a composite substrate for light emitting device according to a first exemplary embodiment of the present invention.
Figure 2:
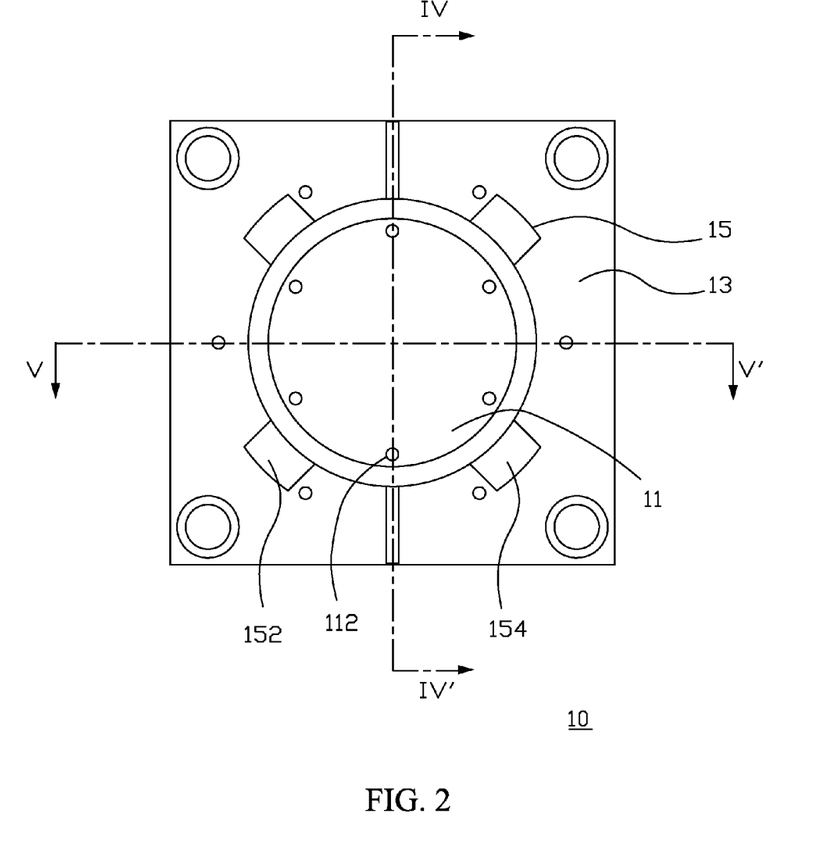
FIG. 2 is a bottom perspective view of a composite substrate for light emitting device of FIG. 1.

Referring to FIG. 1 and FIG. 2, a composite substrate for light emitting device 10 according to a first exemplary embodiment of the present invention includes a metal substrate 11, an insulating carrier 13 and an electrode 15. The metal substrate 11 and the insulating carrier 13 respectively have a front side and a back side that are opposite. The insulating carrier 13 is disposed on the periphery of the metal substrate 11 and connected to the metal substrate 11. The electrode 15 is disposed on the insulating carrier 13. The electrode 15 penetrates the insulating carrier 13. The electrode 15 has a front side and a back side that are opposite. The heights of the back side of the insulating carrier 13 and the back side of the electrode 15 are less than that of the back side of the metal substrate 11. In other words, the convex extents of the back sides of the insulating carrier 13 and the electrode 15 are less than that of the back of the metal substrate 11. An upper surface of the electrode 15 can be lower or higher than an upper surface of the insulating carrier 13, or the two upper surfaces can be on the same level.

As the electrode 15 penetrates the insulating carrier 13, the back side of the electrode 15 can be connected to the printed circuit board electrically, which can make the connector skipped and reduce the cost correspondingly.

Figure 3:
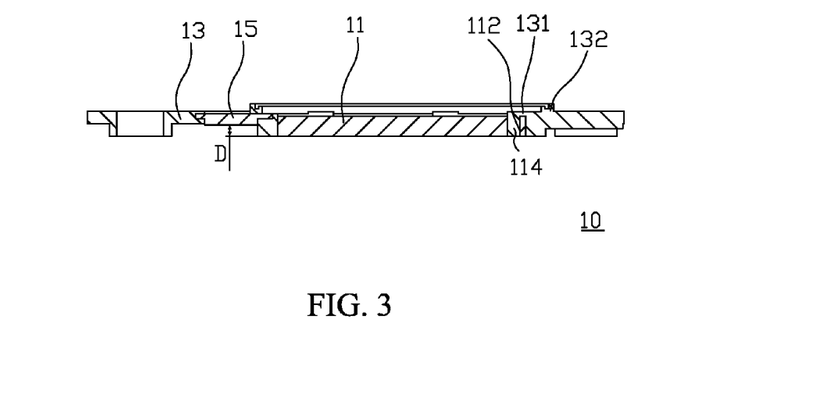
FIG. 3 is a side cross-sectional view of a composite substrate for light emitting device of FIG. 1, taken along line III-III' thereof.

Referring to FIG. 2 and FIG. 3, in the exemplary embodiment, the difference D in height of the back side of the electrode 15 and the back side of the metal substrate 11 is more than 0.2 mm, preferably 0.25 mm; the height of the back side of the insulating carrier 13 and that of the back side of the metal substrate 11 can be equal, and the difference in height of the back sides of the insulating carrier 13 and the metal substrate 11 also can be slightly more or less than D.

To be specific, in the exemplary embodiment, the metal substrate 11 can be made of copper. As the coefficient of thermal conductivity of copper is high, thermal can be transferred easily. A plurality of holes 112 are defined on the metal substrate 11, the holes 112 are filled with insulation material 114. Referring to FIG. 1 and FIG. 3, the insulation material 114 filled in the holes 112 can be separated from the insulating carrier 13, which means the insulating carrier 13 has a convex structures 131 that are prolonged towards the metal substrate 11, and the holes 112 are filled with the insulation material 114, the convex structure 131 is connected to the insulation material 114, the materials used for the insulating carrier 13 and the insulation material 114 in the holes 112 can be the same or not. By defining the holes 112 on the metal substrate 11, and filling the insulation material 114 in the holes 112, the insulation as well as the connection of the insulation material 114 and the insulating carrier 13 can be improved, which also can strengthen the connection of the metal substrate 11 and the insulating carrier 13, which can result in securing the metal substrate 11. Moreover, for the same sake, in other exemplary embodiments of the present invention, if the material of the insulating carrier 13 is same as that of the insulation material 114 used for filling in the holes 112, the convex structure 131 and the insulation material 114 filled in the holes 112 can be integrated.

The insulating carrier 13 can be disposed on the periphery of the metal substrate 11 as a fence. The insulating carrier 13 can be made of epoxy molding compound (EMC), silicone molding compound (SMC) or ceramics.

A dam-shaped convex structure 132 is formed on the insulating carrier 13, as shown in FIG. 1, the dam-shaped convex structure 132 can form an enclosed zone, and the enclosed zone can be formed to be a light emitting zone of the light emitting device by disposing a LED chip sealed by a packaging adhesive that is doped with wavelength transformational substance.

Figure 6:
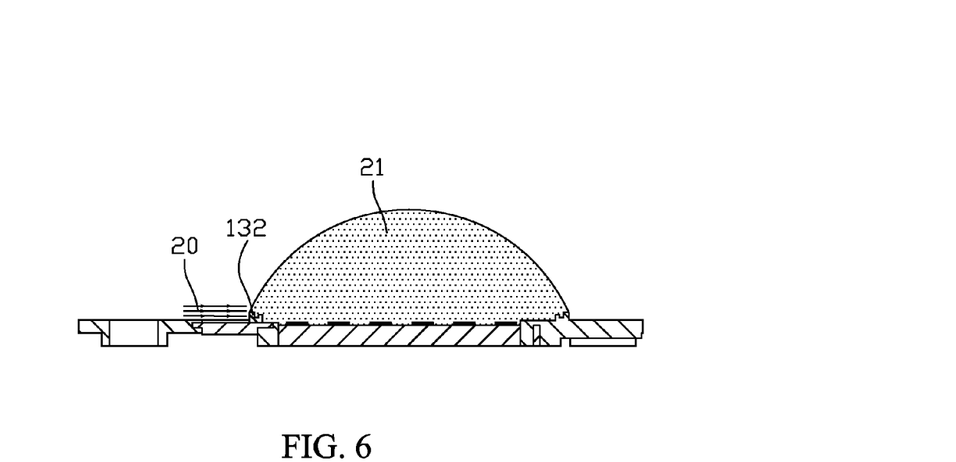
FIG. 6 is a side cross-sectional view of the composite substrate for light emitting device of FIG. 2, the composite substrate for light emitting device combined with a LED chip and sealed by a packaging adhesive.

In addition, a waterproof structure is disposed on the dam-shaped convex structure 132. Referring to FIG. 6, the waterproof structure is applied to make sure the stability of the LED module during working by extending the route that a vapor 20 infiltrates into a LED chip 21 after the composite substrate for light emitting device 10 forms a LED module. In the exemplary embodiment, the waterproof structure is that one or more grooves disposed on the upper side of the dam-shaped convex structure 132, after forming a LED light emitting device, the upper side of the dam-shaped convex structure 132 can be covered with a packaging adhesive, the packaging adhesive can be filled into one or more grooves of the waterproof structure, if the vapor 20 of the environment infiltrates into the light emitting zone, it needs to pass a plurality of grooves, and the route will be longer than the length of the dam-shaped convex structure without waterproof.

Figure 4:
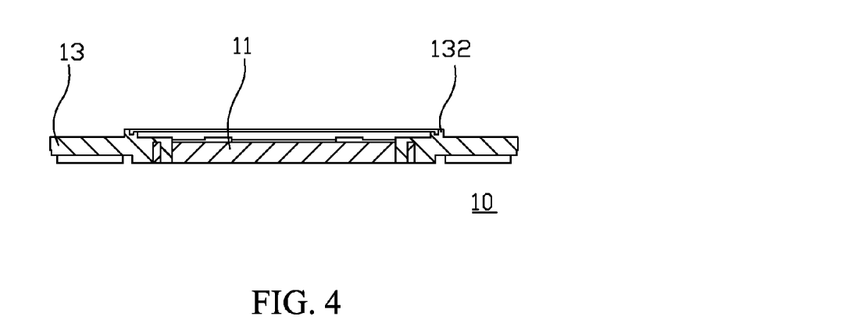
FIG. 4 is a side cross-sectional view of a composite substrate for light emitting device of FIG. 2, taken along line IV-IV' thereof.
Figure 5:
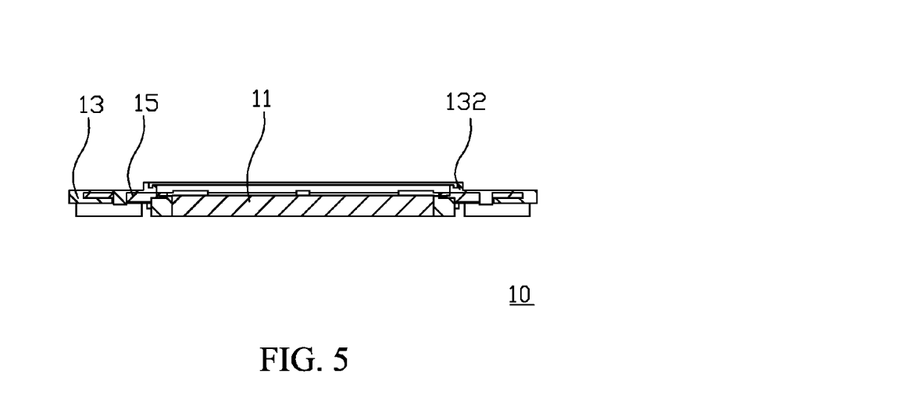
FIG. 5 is a side cross-sectional view of a composite substrate for light emitting device of FIG. 2, taken along line V-V' thereof.

Referring to FIG. 4 and FIG. 5 simultaneously, the insulating carrier 13 can be an integrated unit, which can simplify the material of the composite substrate for light emitting device 10, a metal and an insulation material, resulting in helping design and produce the composite substrate for light emitting device 10.

In addition, referring to FIG. 1 again, screw holes 134 can be formed on the four corners of the insulating carrier 13, the screw holes 134 can be used to secure the printed circuit board when mounting the composite substrate for light emitting device 10 and the printed circuit board.

The electrode 15 can include cathodes 152 and anodes 154. The number of the cathodes 152 and the anodes 154 can be two respectively. Each cathode 152 or anode 154 can form a welding region respectively. Take the cathodes 152 as an example, a welding region 1522 is possessed. The welding region 1522 can be connected to the LED chip electrically when combined the composite substrate for light emitting device 10 and the LED chip.

Second Exemplary Embodiment

Figure 7:
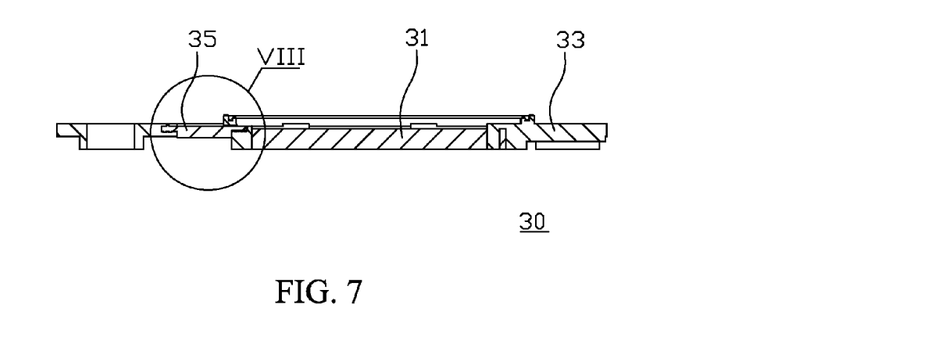
FIG. 7 is a side cross-sectional view of a composite substrate for light emitting device according to a second exemplary embodiment of the present invention.
Figure 8:
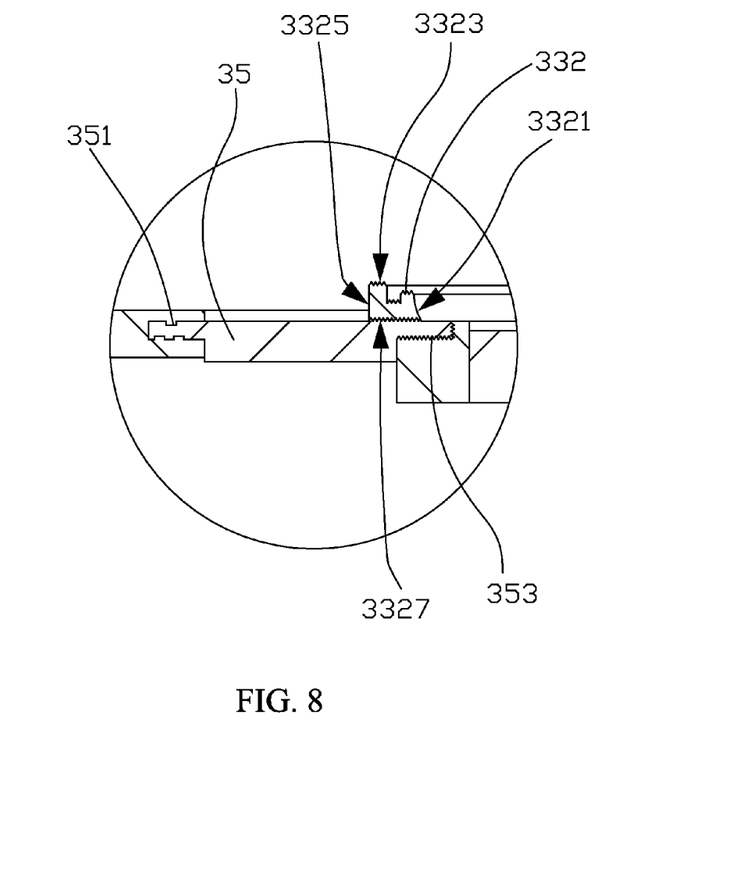
FIG. 8 is an enlarged view of a portion VIII in the composite substrate for light emitting device of FIG. 7.

Referring to a composite substrate for light emitting device 30 according to a second exemplary embodiment of the present invention in FIG. 7 and FIG. 8. FIG. 7 is a side cross-sectional view of the composite substrate for light emitting device 30. FIG. 8 is an enlarged view of a portion VIII in the composite substrate for light emitting device of FIG. 7. The composite substrate for light emitting device 30 is similar to the composite substrate for light emitting device 10, including a metal substrate 31, an insulating carrier 33 and an electrode 35. The metal substrate 31 and the insulating carrier 33 respectively have a front side and a back side that are opposite. The insulating carrier 33 is disposed on the periphery of the metal substrate 31 and connected to the metal substrate 31. The electrode 35 is disposed on the insulating carrier 33. The electrode 35 penetrates the insulating carrier 33. The electrode 35 has a front side and a back side that are opposite. The heights of the back side of the insulating carrier 33 and the back side of the electrode 35 are less than that of the back side of the metal substrate 31. A waterproof structure 332 of the insulating carrier 33 is a waterproof groove.

The difference of the composite substrate for light emitting device 30 and the composite substrate for light emitting device 10 can be that the waterproof structure 332 has an inner side 3321, an upper side 3323, an outer side 3325 and a bottom 3327 that are connected with each other in order. The inner side 3321 is close to the metal substrate 31 and forms a reflecting surface.

The outer side 3325 and the inner side 3321 are opposite, the upper side 3323 is connected between the outer side 3325 and the inner side 3321 and formed a groove face. The bottom 3327 and the upper side 3323 are opposite and connected the outer side 3325 and the inner side 3321. A roughening structure 353 is formed on the upper side 3323 and the bottom 3327 respectively. The roughening structure 353 can be consisted of tiny toothed or continuous tiny concave-convex structures.

When the composite substrate for light emitting device 30 is used to form a LED module, the groove face on the upper side 3323 can be covered with a packaging adhesive, the stability of the LED module can be guaranteed by extending the route that the vapor infiltrates into the LED chip as the groove face is formed on the upper side 3323. Furthermore, the roughening structure 353 formed on the upper side 3323 can be combined with the packaging adhesive to enlarge the contact area of the upper side 3323 and the packaging adhesive, and a mesh structure can be formed to strengthen the bond of the packaging adhesive and the insulating carrier 33.

The roughening structure 353 formed on the bottom 3327 of the waterproof structure 332 can be connected to the electrode 35 to improve the strength of bond of the insulating carrier 33 and the electrode 35. A reflecting surface formed on the inner side 3321 can reflect the light emitting from the LED chip when the composite substrate for light emitting device 30 is used to form a LED module, which can assist adjusting the direction of the light and improve the utilization of the light, the reflecting surface can be achieving by forming a high reflecting insulating film or a metal reflecting layer on the inner side 3321.

Additionally, in the exemplary embodiment, to increase the bond strength of the electrode 35 and the insulating carrier 33, a concave-convex structure 351 or the roughening structure 353 can be formed on the connecting surface of the electrode 35 and the insulating carrier 33.

Third Exemplary Embodiment

Figure 9:
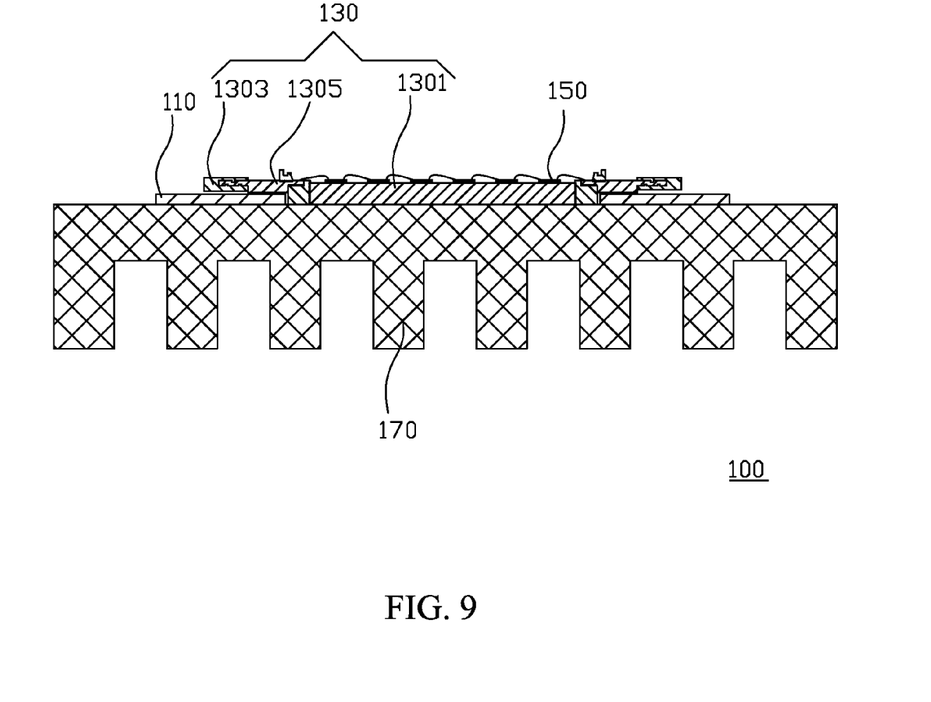
FIG. 9 is a side cross-sectional view of a LED module according to a third exemplary embodiment of the present invention.

Referring to FIG. 9, a LED module 100 according to the third exemplary embodiment of the present invention. The LED module 100 includes a printed circuit board 110, a composite substrate for light emitting device 130, a LED chip 150 and a heat sink 170. The composite substrate for light emitting device 130 includes a metal substrate 1301, an insulating carrier 1303 and an electrode 1305, it can be one of the composite substrate for light emitting devices according to the exemplary embodiments above. The LED chip 150 is disposed on the front side of the metal substrate 1301 and connected to the electrode 1305 electrically. The electrode 1305 penetrates the insulating carrier 1303. The heights of the back side of the insulating carrier 1303 and the back side of the electrode 1305 are less than that of the back side of the metal substrate 1301. The printed circuit board 110 is connected to the back side of the insulating carrier 1303 and the back side of the electrode 1305. The printed circuit board 110 is connected to the electrode 1305 electrically. The heat sink 170 is connected to the back side of the metal substrate 1301 thermally.

The LED module 100 above, as the electrode 1305 penetrates the insulating carrier 1303, the back side of the electrode 1305 can be connected to the printed circuit board 110 electrically, which can make the connector skipped and reduce the cost correspondingly; and because the heights of the back side of the insulating carrier 1303 and the back side of the electrode 1305 are less than that of the back side of the metal substrate 1301, the heat sink 170 can be connected to the back side of the metal substrate 1301 directly for thermal transfer, speeding up the thermal dissipation of the metal substrate 1301 and improving the performance of the LED module 100.

In summary, according to the LED module and composite substrate for light emitting devices in exemplary embodiments of the present invention, as the electrode of the composite substrate for light emitting device penetrates the insulating carrier, the back side of the electrode can be connected to the printed circuit board electrically, which can make the connector skipped and reduce the cost correspondingly.

The embodiments are chosen and described in order to best explain the principles of the composite substrate for light emitting device and the LED module in the present invention. The foregoing description of the preferred embodiment of the invention has been presented for purposes of illustration and description of the best mode practical application. Obviously, many modifications and variations will be apparent to practitioners skilled in this art. It is not intended to be exhaustive or to limit the invention to the precise form or to exemplary embodiments disclosed. It is intended that the scope of the invention is defined by the claims appended hereto and their equivalents in which all terms are meant in their broadest reasonable sense unless otherwise indicated.

What is claimed is:

1. A composite substrate for light emitting device, comprising: a metal substrate, an insulating carrier and an electrode, the metal substrate and the insulating carrier respectively having a front side and a back side that are opposite, the insulating carrier disposed on the periphery of the metal substrate and fixed with the metal substrate, the electrode disposed on the insulating carrier, wherein the electrode penetrates the insulating carrier, the electrode has a front side and a back side that are opposite, heights of the back side of the insulating carrier and the back side of the electrode are less than that of the back side of the metal substrate;
    wherein a plurality of holes are defined on the metal substrate, the holes are filled with insulation material, the insulating carrier has a plurality of convex structures that are prolonged towards the metal substrate, the convex structures are connected to the insulation material in the holes.

2. The composite substrate for light emitting device according to claim 1, wherein a difference in height of the back side of the electrode and the back side of the metal substrate is more than 0.2 mm.

3. The composite substrate for light emitting device according to claim 1, wherein an upper surface of the electrode is lower or higher than an upper surface of the insulating carrier, or the two upper surfaces are on the same level.

4. The composite substrate for light emitting device according to claim 1, wherein the metal substrate is made of copper.

5. The composite substrate for light emitting device according to claim 1, wherein the insulating carrier forms a waterproof structure close to the bottom of the metal substrate, the waterproof structure is a waterproof groove.

6. The composite substrate for light emitting device according to claim 5, wherein the waterproof structure has an inner side, an upper side, an outer side and a bottom that are connected to each other in order, the inner side is close to the metal substrate and forms a reflecting surface, the outer side and the inner side are opposite, the outer side and the inner side are connected by the upper side and formed a groove face, the bottom is opposite to the upper side, roughening structures are formed on the upper side and the bottom respectively.

7. The composite substrate for light emitting device according to claim 1, wherein a roughening structure is formed on a connection surface of the insulating carrier and the metal substrate, a roughening structure is formed on a connection surface of the insulating carrier and the electrode, the insulating carrier is an integrated structure.

8. The composite substrate for light emitting device according to claim 1, wherein the electrode comprises a cathode and an anode, the electrode forms a welding region where close to the metal substrate.

9. A LED module, comprising: a printed circuit board, a composite substrate for light emitting device, a LED chip and a heat sink, the composite substrate for light emitting device comprising a metal substrate, an insulating carrier and an electrode, the metal substrate and the insulating carrier respectively having a front side and a back side that are opposite, the insulating carrier disposed on the periphery of the metal substrate and fixed with the metal substrate, the electrode disposed on the insulating carrier, the LED chip disposed on the front side of the metal substrate and connected to the electrode electrically, wherein the electrode penetrates the insulating carrier, the electrode has a front side and a back side that are opposite, heights of the back side of the insulating carrier and the back side of the electrode are less than that of the back side of the metal substrate, the printed circuit board is connected to the back side of the insulating carrier and the back side of the electrode, the printed circuit board is connected to the electrode electrically, the heat sink is connected to the back side of the metal substrate thermally.

10. The LED module according to claim 9, wherein difference in height of the back side of the electrode and the back side of the metal substrate is 0.25 mm.

11. The LED module according to claim 9, wherein thickness of the printed circuit board is less than or equal to the difference in height of the back side of the electrode and the back side of the metal substrate.

12. The LED module according to claim 9, wherein the metal substrate is made of copper.

13. The LED module according to claim 9, wherein a plurality of holes are defined on the metal substrate, the holes are filled with insulation material, the insulating carrier has a plurality of convex structures that are prolonged towards the metal substrate, the convex structures are connected to the insulation material in the holes.

14. The LED module according to claim 9, wherein the insulating carrier forms a waterproof structure close to the bottom of the metal substrate, the waterproof structure is a waterproof groove.

15. The LED module according to claim 14, wherein the waterproof structure has an inner side, an upper side, an outer side and a bottom that are connected to each other in order, the inner side is close to the metal substrate and forms a reflecting surface, the outer side and the inner side are opposite, the outer side and the inner side are connected by the upper side and formed a groove face, the bottom is opposite to the upper side, roughening structures are formed on the upper side and the bottom respectively.

16. The LED module according to claim 9, wherein a roughening structure is formed on a connection surface of the insulating carrier and the metal substrate, a roughening structure is formed on a connection surface of the insulating carrier and the electrode, the insulating carrier is an integrated structure.

17. The LED module according to claim 9, wherein the electrode comprises a cathode and an anode, the electrode forms a welding region where close to the metal substrate.

18. A composite substrate for light emitting device, comprising: a metal substrate, an insulating carrier and an electrode, the metal substrate and the insulating carrier respectively having a front side and a back side that are opposite, the insulating carrier disposed on the periphery of the metal substrate and fixed with the metal substrate, the electrode disposed on the insulating carrier, wherein the electrode penetrates the insulating carrier, the electrode has a front side and a back side that are opposite, heights of the back side of the insulating carrier and the back side of the electrode are less than that of the back side of the metal substrate;

wherein the insulating carrier forms a waterproof structure close to the bottom of the metal substrate, the waterproof structure is a waterproof groove;

wherein the waterproof structure has an inner side, an upper side, an outer side and a bottom that are connected to each other in order, the inner side is close to the metal substrate and forms a reflecting surface, the outer side and the inner side are opposite, the outer side and the inner side are connected by the upper side and formed a groove face, the bottom is opposite to the upper side, roughening structures are formed on the upper side and the bottom respectively.

19. The composite substrate for light emitting device according to claim 18, wherein a roughening structure is formed on a connection surface of the insulating carrier and the metal substrate, a roughening structure is formed on a connection surface of the insulating carrier and the electrode, the insulating carrier is an integrated structure.

20. The composite substrate for light emitting device according to claim 18, wherein the electrode comprises a cathode and an anode, the electrode forms a welding region where close to the metal substrate.

* * * * *